United States Patent
Kim et al.

(10) Patent No.: US 8,304,282 B2
(45) Date of Patent: *Nov. 6, 2012

(54) METHOD FOR MANUFACTURING A SOLAR CELL

(75) Inventors: Young Su Kim, Seoul (KR); Sang Ho Kim, Seoul (KR)

(73) Assignees: Samsung SDI Co., Ltd., Yongin-si (KR); Samsung Display Co., Ltd., Yongin (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/335,707

(22) Filed: Dec. 22, 2011

(65) Prior Publication Data

US 2012/0094426 A1 Apr. 19, 2012

Related U.S. Application Data

(63) Continuation of application No. 12/939,463, filed on Nov. 4, 2010, now Pat. No. 8,119,441.

(30) Foreign Application Priority Data

Jul. 20, 2010 (KR) .................. 10-2010-0069963

(51) Int. Cl.
 *H01L 31/18* (2006.01)
(52) U.S. Cl. .................. 438/87; 136/256
(58) Field of Classification Search .......... 438/87
 See application file for complete search history.

(56) References Cited

U.S. PATENT DOCUMENTS

| | | | |
|---|---|---|---|
| 4,927,770 A | 5/1990 | Swanson | |
| 5,053,083 A | 10/1991 | Sinton | |
| 6,998,288 B1 | 2/2006 | Smith et al. | |
| 8,119,441 B2 * | 2/2012 | Kim et al. | 438/87 |
| 2009/0142911 A1 | 6/2009 | Asano et al. | |
| 2009/0305456 A1 | 12/2009 | Funakoshi | |
| 2010/0147378 A1 * | 6/2010 | Lee et al. | 136/256 |
| 2010/0190286 A1 | 7/2010 | Kohira et al. | |

OTHER PUBLICATIONS

U.S. Office action dated May 2, 2011, for U.S. Appl. No. 12/939,463 (now U.S. Patent 8,119,441), 10 pages.
U.S. Notice of Allowance dated Oct. 7, 2011, for U.S. Appl. No. 12/939,463 (now U.S. Patent 8,119,441) 8 pages.
U.S. Office action dated Mar. 9, 2012, for cross reference U.S. Appl. No. 13/335,711, 10 pages.

* cited by examiner

*Primary Examiner* — Thao P. Le
(74) *Attorney, Agent, or Firm* — Christie, Parker & Hale, LLP

(57) ABSTRACT

A method for manufacturing a solar cell comprises disposing a first doping layer on a substrate, forming a first doping layer pattern by patterning the first doping layer to expose a portion of the substrate, disposing a second doping layer on the first doping layer pattern to cover the exposed portion of the substrate, diffusing an impurity from the first doping layer pattern which forms a first doping region in a surface of the substrate, and diffusing an impurity from the second doping layer which forms a second doping region in the surface of the substrate, wherein the forming of the first doping layer pattern uses an etching paste.

19 Claims, 8 Drawing Sheets

METHOD FOR MANUFACTURING A SOLAR CELL

CROSS-REFERENCE TO RELATED APPLICATION(S)

This application is a continuation of U.S. patent application Ser. No. 12/939,463, filed Nov. 4, 2010, which claims priority to Korean Patent Application No. 10-2010-0069963, filed on Jul. 20, 2010, and all the benefits accruing therefrom under 35 U.S.C. §119, the entire contents of all of which are herein incorporated by reference.

BACKGROUND OF THE INVENTION (a) Field of the Invention

The present invention generally relates to a manufacturing method of a solar cell.

(b) Description of the Related Art

A solar battery is a device that converts photonic energy, e.g., solar light energy, into electrical energy using a photoelectric effect.

It is important to produce clean energy, also referred to as next-generation energy that can replace existing fossil fuel energy, that causes a green house effect due to carbon dioxide ($CO_2$) discharge and atomic energy that pollutes the earth's environment, such as via atmospheric pollution by radioactive waste, for example.

A solar cell that uses silicon as a light absorption layer may be classified into a crystalline substrate (e.g., wafer) type solar cell and a thin layer type (e.g., amorphous, polycrystalline) solar cell. In addition, the various types of solar cells include a compound thin layer solar cell that uses copper indium gallium selenide (CIGS or CuInGaSe2) or cadmium telluride (CdTe), a group III-V solar cell, a dye sensitized solar cell, and an organic solar cell, for example.

A basic structure of a solar cell typically has a conjunction structure of a P-type semiconductor and an N-type semiconductor, such as a diode, and if light is absorbed in the solar cell, electrons having a negative (−) charge and holes having a positive (+) charge caused by the removal of the electrons from atoms are generated by interaction of the light and a material that constitutes a semiconductor of the solar cell, such that a current flows while the electrons and holes move through the solar cell.

This phenomenon is called a photovoltaic effect. In the P-type and N-type semiconductors that constitute the solar cell, the electrons are drawn to the N-type semiconductor and the holes are drawn to the P-type semiconductor such that they move to electrodes that are connected to the N-type semiconductor and the P-type semiconductor, respectively, and if the electrodes are connected to wires, a current flows through the electrodes and the wires, thereby generating electric power.

In a back contact solar cell, which is one of the structures of the solar cell, all of a P-type semiconductor, an N-type semiconductor, and metal grids that are connected thereto are disposed in a rear side of the solar cell where a front side of the solar cell absorbs incident light.

One method of increasing cost competitiveness and efficiency of the back contact solar cell without increasing a number of processing steps required in its manufacture, is by decreasing shunt resistance of the solar cell.

BRIEF SUMMARY OF THE INVENTION

The present invention provides a manufacturing method of a solar cell realizing high efficiency without increasing a number of manufacturing processes.

An exemplary embodiment of a manufacturing method of a solar cell according to the present invention includes disposing a first doping layer on a substrate; forming a first doping layer pattern by patterning the first doping layer so that a portion of the substrate is exposed; disposing a second doping layer on the first doping layer pattern so as to cover the exposed portion of the substrate; diffusing an impurity from the first doping layer pattern to form a first doping region in a surface of the substrate; and diffusing an impurity from the second doping layer to form a second doping region in the surface of the substrate, wherein the forming of the first doping layer pattern uses an etching paste.

In one exemplary embodiment, a thickness of a side wall of the first doping layer pattern may be gradually decreased as the side wall of the first doping layer pattern becomes closer to a boundary of the exposed substrate in the forming of the first doping layer pattern.

In one exemplary embodiment, the forming of the first doping layer pattern may be executed at room temperature.

In one exemplary embodiment, the method may further include removing the etching paste by deionized (DI) water after ultrasonic wave treatment.

In one exemplary embodiment, a process time of the forming of the first doping layer pattern may be controlled according to the thickness of the first doping layer.

In one exemplary embodiment, the process time may be about two minutes.

In one exemplary embodiment, the forming of the first doping layer pattern may include forming the etching paste through a screen printing or an inkjet printing method.

In one exemplary embodiment, a buffer layer may be formed between the first doping region and the second doping region, and the buffer layer may be formed on the surface of the substrate that corresponds to a side wall of the first doping layer pattern.

In one exemplary embodiment, a first unit which refers to the first doping region and the second doping region where the buffer layer is disposed therebetween may be repeatedly formed on the surface of the substrate.

In one exemplary embodiment, the buffer layer may be an LDD (lightly doped drain) region, and may include a first buffer layer that is doped with a substantially same type of impurity as the impurity of the first doping region and a second buffer layer that is doped with a substantially same type of impurity as the impurity of the second doping region.

In one exemplary embodiment, the forming of the first doping region and the second doping region by diffusing the impurities may include a heat treatment process.

In one exemplary embodiment, the method may further include removing the first doping layer pattern and the second doping layer.

In one exemplary embodiment, the forming of the first doping region may be substantially simultaneously executed with the forming of the second doping region.

In one exemplary embodiment, the substrate may include a front side and a back side, and the first doping region and the second doping region may be disposed at the back side of the substrate.

In one exemplary embodiment, the method may further include forming a back side electrode that includes a first electrode that is connected to the first doping region and a second electrode that is connected to the second doping region on the back side of the substrate.

In one exemplary embodiment, light may be absorbed from an outside through the front side of the substrate.

In one exemplary embodiment, the first doping layer and the second doping layer may include silicon oxides that include different conductive impurities.

In one exemplary embodiment, the first doping region and the second doping region may include different conductive impurities.

In one exemplary embodiment, the substrate may be an N-type silicon wafer.

Another exemplary embodiment of a manufacturing method of a solar cell according to the present invention includes disposing a first doping layer on a substrate; forming a first doping layer pattern by patterning the first doping layer so that a portion of the substrate is exposed; injecting ions into the substrate using the first doping layer pattern as a mask; and forming a first doping region on a surface of the substrate by diffusing an impurity from the first doping layer pattern, wherein the first doping region forms a PN conjunction with the second doping region that is formed on the surface of the substrate into which the ions are injected, and wherein the forming of the first doping layer pattern uses an etching paste.

In one exemplary embodiment, a thickness of a side wall of the first doping layer pattern may be gradually decreased as the side wall of the first doping layer pattern becomes closer to a boundary of the exposed portion of the substrate in the forming of the first doping layer pattern.

In one exemplary embodiment, the forming of the first doping layer pattern may be executed at room temperature.

In one exemplary embodiment, the method may further include removing the etching paste, and the etching paste is removed by deionized (DI) water after ultrasonic wave treatment.

A process time of the forming of the first doping layer pattern may be controlled according to a thickness of the first doping layer.

In one exemplary embodiment, the process time may be about two minutes.

In one exemplary embodiment, the forming of the first doping layer pattern may include forming the etching paste through a screen printing or an inkjet printing method.

A buffer layer may be formed between the first doping region and the second doping region, and the buffer layer may be formed on the surface of the substrate that corresponds to a side wall of the first doping layer pattern.

In one exemplary embodiment, the forming of the PN conjunction of the first doping region and the second doping region may include a heat treatment process.

In one exemplary embodiment, a first unit which refers to the first doping region and the second doping region with the buffer layer which is disposed therebetween may be repeatedly formed on the surface of the substrate.

In one exemplary embodiment, the buffer layer may be an LDD (lightly doped drain) region, and may include the first buffer layer that is doped with a substantially same type of impurity as the impurity of the first doping region and the second buffer layer that is doped with a substantially same type of impurity as the impurity of the second doping region.

In one exemplary embodiment, the method may further include removing the first doping layer pattern.

In one exemplary embodiment, the substrate may include a front side and a back side, and the first doping region and the second doping region may be disposed at the back side of the substrate.

In one exemplary embodiment, the method may further include forming a back side electrode that includes a first electrode that is connected to the first doping region and a second electrode that is connected to the second doping region on the back side of the substrate.

In one exemplary embodiment, light may be absorbed from an outside through the front side of the substrate.

In one exemplary embodiment, the first doping layer and the second doping layer may be formed of silicon oxides that include different conductive impurities.

In one exemplary embodiment, the first doping region and the second doping region may include different conductive impurities.

In one exemplary embodiment, the substrate may be an N-type silicon wafer.

In an exemplary embodiment according to the present invention, the silicon oxide is patterned using the etching paste in the manufacturing process of the solar cell such that the patterned layer has a thickness gradation on the edge portion.

In one exemplary embodiment, the self-aligned buffer layer may be formed between the doping regions using the thickness gradation.

In one exemplary embodiment, a short that may be generated by directly contacting the doping regions having the different conductive type impurities may be prevented.

BRIEF DESCRIPTION OF THE DRAWINGS

The above and other aspects, advantages and features of this disclosure will become more apparent by describing in further detail embodiments thereof with reference to the accompanying drawings, in which:

FIG. 4 is a cross-sectional view taken along line IV-IV' of FIG. 3; and

DETAILED DESCRIPTION OF THE EMBODIMENTS

Figure 1:
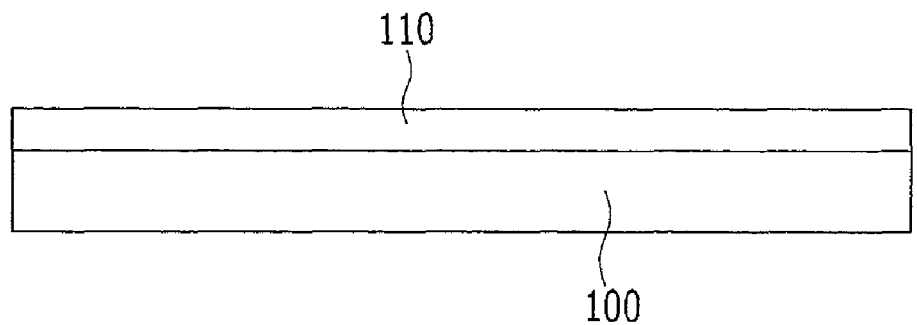
FIGS. 1, 2, and 4 to 8 are cross-sectional views showing an exemplary embodiment of a manufacturing method of a solar cell according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present invention will be described in further detail with reference to the accompanying drawings.

FIGS. 1, 2, and 4 to 8 are cross-sectional views showing an exemplary embodiment of a manufacturing method of a solar cell according to the present invention.

Referring to FIG. 1, a first doping layer 110 is formed on a substrate 100.

In one exemplary embodiment, the substrate 100 may be an N-type silicon wafer.

In one exemplary embodiment, a polarity of an impurity and a doping region may be changed to be applied to a P-type silicon wafer.

Figure 2:
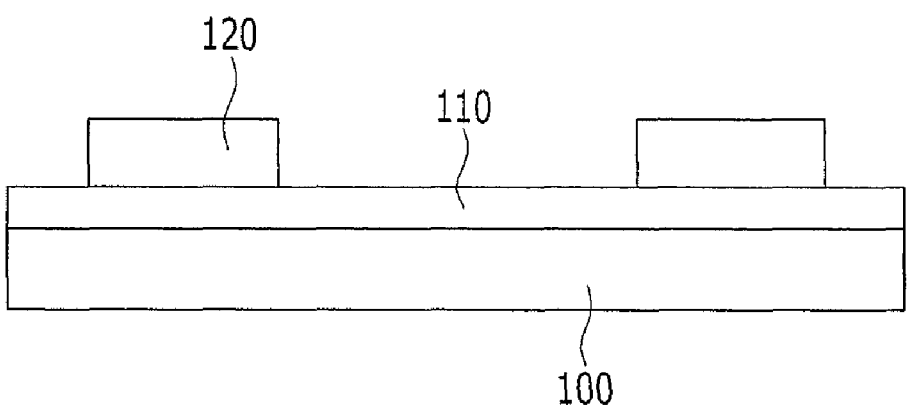

Referring to FIG. 2, an etching paste 120 is disposed (e.g., printed) on the first doping layer 110.

In one exemplary embodiment, a screen printing method or an inkjet printing method may be used to dispose the etching paste on the first doping layer 110.

The etching paste 120 may be disposed (e.g., formed) on the first doping layer 110 corresponding to a portion to be etched.

Figure 3:
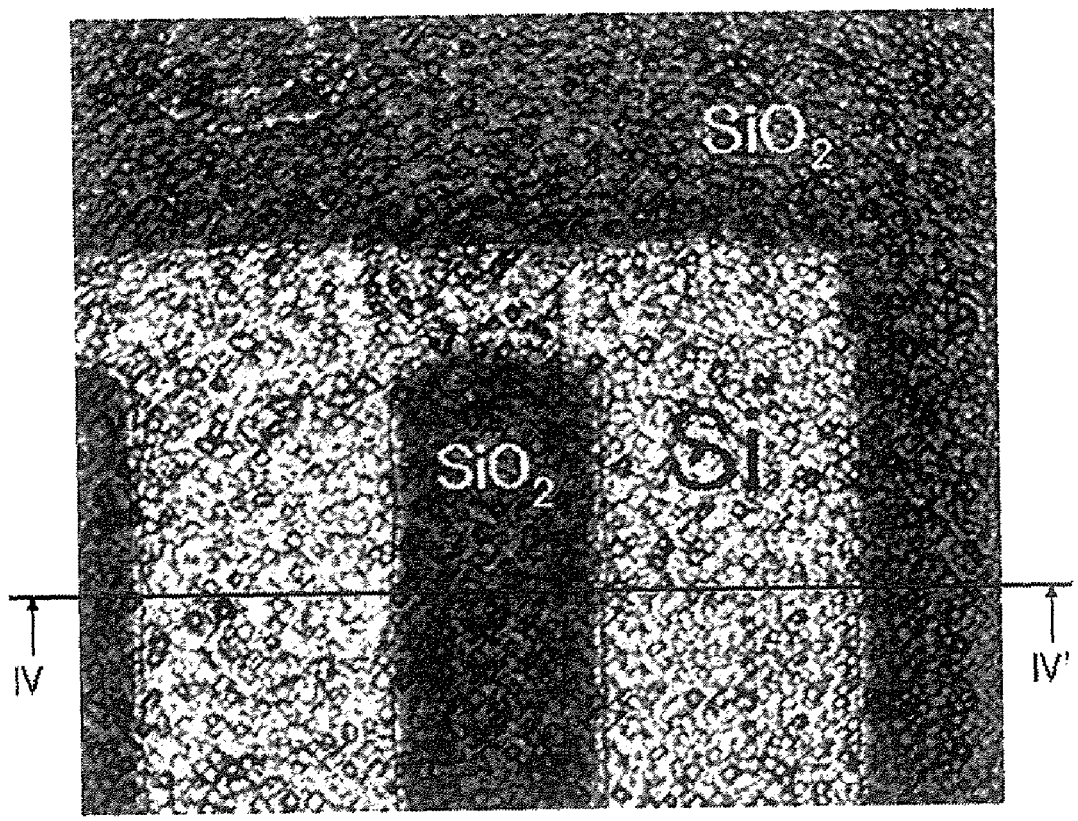
FIG. 3 is a photograph showing a variation of a thickness of an edge portion of a silicon oxide according to the exemplary embodiment of a manufacturing process of a solar cell according to the present invention.

FIG. 3 is a photograph showing a variation of thickness of an edge portion of a silicon oxide according to an exemplary embodiment of a manufacturing process of a solar cell according to the present invention.

Figure 4:
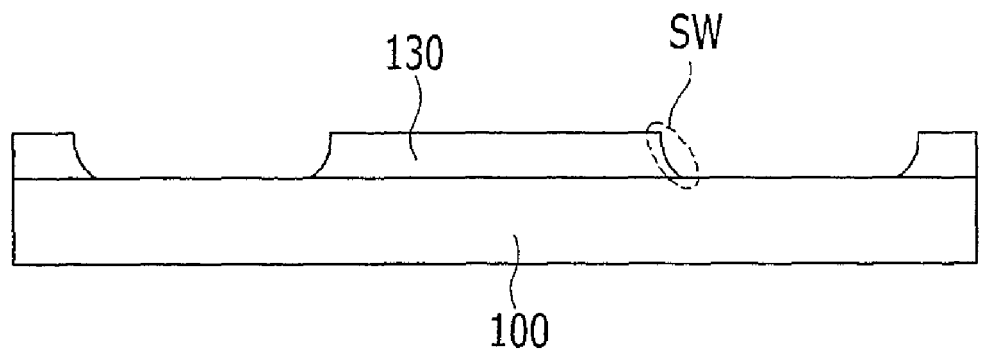

FIG. 4 is a cross-sectional view taken along line IV-IV' of FIG. 3.

Referring to FIGS. 3 and 4, the first doping layer 110 disposed with the etching paste 120 is etched to form a first doping layer pattern 130.

In an exemplary embodiment of the manufacturing method of the solar cell according to the present invention, isishape® provided by Merck & Co., Inc. of Germany may be used as the etching paste 120 for the printing.

The isishape® may selectively etch a layer including at least one of a transparent conductive layer, silicon, silicon dioxide, silicon nitride, and various metals.

The formation of first doping layer pattern 130 using the etching paste 120 is executed at room temperature in a range of about 15 Celsius (° C.) to about 25° C.

In the present exemplary embodiment according to the present invention, the isishape® provided by Merck & Co., Inc. used as the etching paste for the printing is disposed on the first doping layer 110 and etches the first doping layer 110 without application of heat to form the first doping layer pattern 130 such that the heat being applied to the first doping layer pattern 130 may be prevented, thereby preventing the substrate 100 from being doped due to a diffusion of an impurity.

In one exemplary embodiment, the etching paste 120 may etch the first doping layer 110 for about two minutes according to a thickness of the first doping layer 110.

In one exemplary embodiment, a thickness of the first doping layer pattern 130 may be in a range of about 500 Angstrom (Å) to about 20,000 Å.

If the first doping layer 110 is patterned to form the first doping layer pattern 130, a portion of the substrate 100 is exposed.

In one exemplary embodiment, the first doping layer pattern 130 may include a silicon oxide doped with the N-type impurity, for example, but is not limited thereto.

In one exemplary embodiment, the silicon oxide may be silicon dioxide ($SiO_2$), for example, but is not limited thereto.

In one exemplary embodiment, the N-type impurity may be phosphorus (P) or arsenic (As), for example, but is not limited thereto and may be other materials with similar characteristics.

In one exemplary embodiment according to the present invention, if the first doping layer pattern 130 is formed using the isishape® of Merck & Co., Inc. as the etching paste 120 for the printing, a side wall SW of the first doping layer pattern 130 has a thickness gradation.

In detail, when etching the first doping layer 110 including a silicon oxide by the etching paste 120, the etching paste 120 flows to a side surface thereof such that the thickness gradation is formed.

A color of the silicon oxide formed on the substrate 100 made of the silicon wafer is changed according to a variation of the thickness such that the thickness may be confirmed according to the color of the silicon oxide formed on the substrate 100.

Referring to the optical microscope photograph of FIG. 3, a portion represented by pale blue-green color is the portion where the first doping layer pattern 130 is thick, and a portion represented by yellow color is the portion where the substrate 100 is exposed and the first doping layer pattern 130 does not exist since the etching paste 120 is etched.

There are portions represented by orange color and violet color between the pale blue-green colored portion and the yellow colored portion, and this color gradation means that the thickness of the first doping layer pattern 130 is gradually changed.

The substrate 100 includes a front side and a back side that is opposite to the front side.

The first doping layer pattern 130 is formed on the back side of the substrate 100.

The front side of the substrate 100 corresponds to a side into which light is absorbed from an outside.

In one exemplary embodiment, the etching paste 120 may be removed by deionized (DI) water after ultrasonic treatment.

Figure 5:
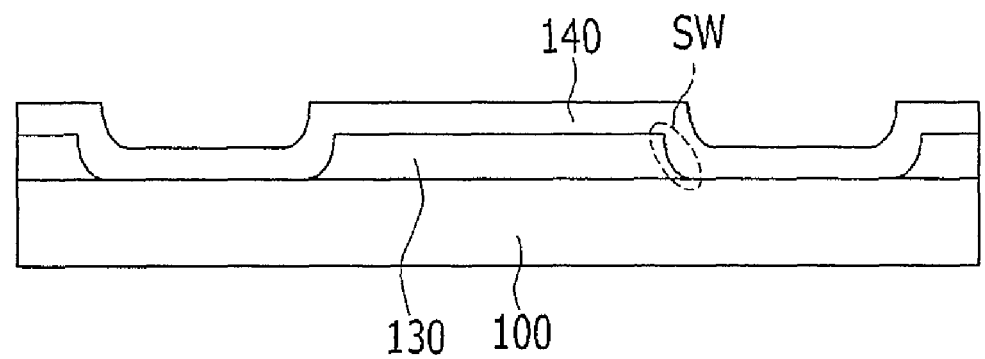

Referring to FIG. 5, a second doping layer 140 covering the exposed portion of the substrate 100 is disposed on the first doping layer pattern 130.

In one exemplary embodiment, the second doping layer 140 may include silicon oxide doped with the P-type impurity, for example, but is not limited thereto.

In one exemplary embodiment, the silicon oxide may be silicon dioxide (SiO2), for example, but is not limited thereto.

In one exemplary embodiment, the P-type impurity may be boron (B), gallium (Ga), or indium (In), for example, but is not limited thereto and may be other materials with similar characteristics.

Figure 6:
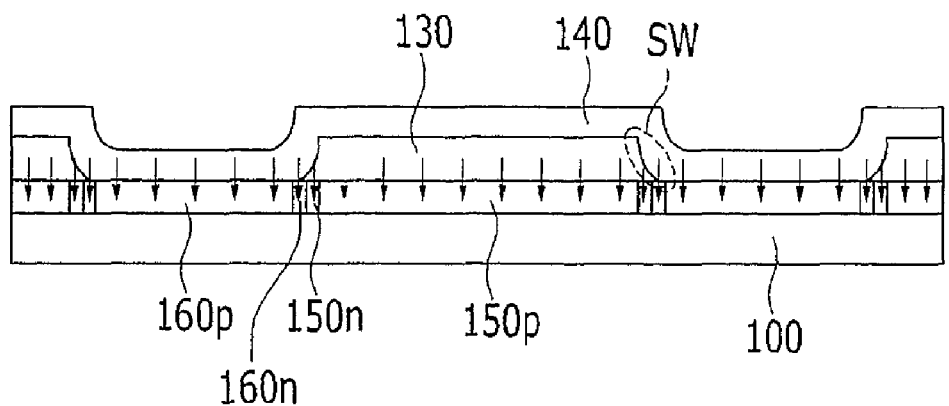

Referring to FIG. 6, heat treatment is executed to diffuse an impurity from the first doping layer pattern 130 such that a first doping region 150p is formed.

In one exemplary embodiment, the heat treatment process may be executed at a temperature of about 1000° C. for about one hour.

In the present exemplary embodiment, an impurity is diffused from the second doping layer 140 contacting the substrate 100 such that a second doping region 160p is formed.

The first doping region 150p and the second doping region 160p may be substantially simultaneously formed.

Buffer layers 150n and 160n are formed between the first doping region 150p and the second doping region 160p.

The buffer layers 150n and 160n are formed on a surface where the side wall SW of the first doping layer pattern 130 contacts the substrate.

The thickness of the side wall SW of the first doping layer pattern 130 is gradually decreased according to a distance from the surface of the substrate 100 formed with the first doping region 150p to the surface of the substrate 100 formed with the second doping region 160p such that the buffer layers 150n and 160n are doped with the impurity at a relatively smaller amount than that of the first doping region 150p and the second doping region 160p.

That is, the impurity of the first doping layer pattern 130 and the impurity of the second doping layer 140 are substantially simultaneously diffused by a structural characteristic of the side wall SW of the first doping layer pattern 130 such that the buffer layers 150n and 160n are formed.

The buffer layers 150n and 160n are lightly doped drain (LDD) regions, and include the first buffer layer 150n close to the first doping region 150p and the second buffer layer 160n close to the second doping region 160p.

The first buffer layer 150n may be doped with a substantially same type of impurity as that of the first doping region 150p, and the second buffer layer 160n may be doped with a substantially same type of impurity as that of the second doping region 160p.

The buffer layers 150n and 160n prevent a short which occurs by directly contacting the first doping region 150p and the second doping region 160p with each other.

In an exemplary embodiment of the solar cell manufactured according to the present invention, the first doping region 150p and the second doping region 160p form a PN conjunction.

Figure 7:
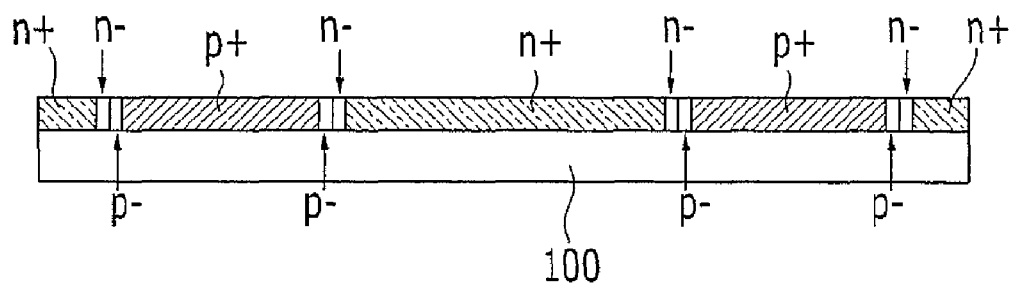

Referring to FIG. 7, the first doping layer pattern 130 and the second doping layer 140 disposed on the substrate 100 are removed.

In the present exemplary embodiment, the first doping layer pattern 130 and the second doping layer 140 may be etched using hydrogen fluoride (HF) that has large etching selectivity with respect to the substrate 100.

When the first doping region 150p and the second doping region 160p between which the buffer layers 150n and 160n are disposed are the first unit, the first unit is repeatedly formed on the surface of the substrate 100.

Figure 8:
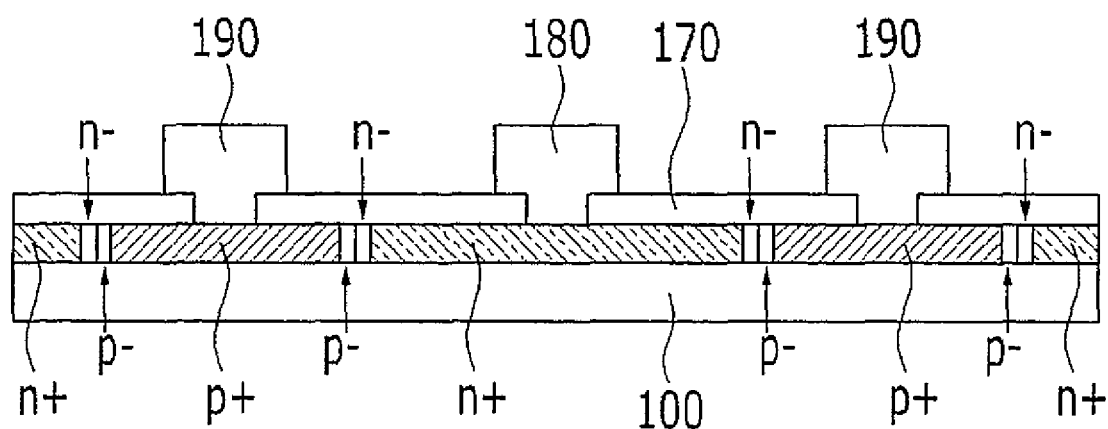

Referring to FIG. 8, an insulating layer 170 that has an opening (not shown) is disposed on the first doping region 150p and the second doping region 160p.

In addition, a first electrode 180 and a second electrode 190 that are connected to the first doping region that is represented by n+ and the second doping region that is represented by p+ through the opening, respectively, are disposed.

FIGS. 9 to 14 are cross-sectional views that illustrate another exemplary embodiment of a manufacturing method of a solar cell according to the present invention.

Figure 9:
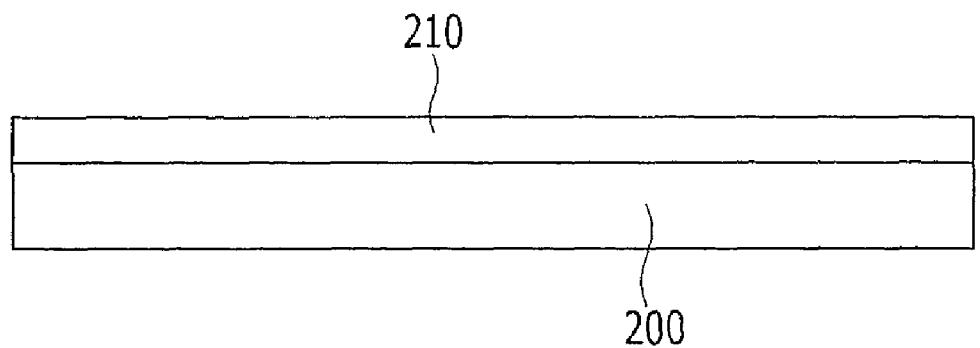
FIGS. 9 to 14 are cross-sectional views showing another exemplary embodiment of a manufacturing method of a solar cell according to the present invention.

Referring to FIG. 9, a first doping layer 210 is disposed on a substrate 200.

In one exemplary embodiment, the substrate 200 may be an N-type silicon wafer.

In one exemplary embodiment, a polarity of the impurity and a doping region may be changed to be applied to a P-type silicon wafer.

Figure 10:
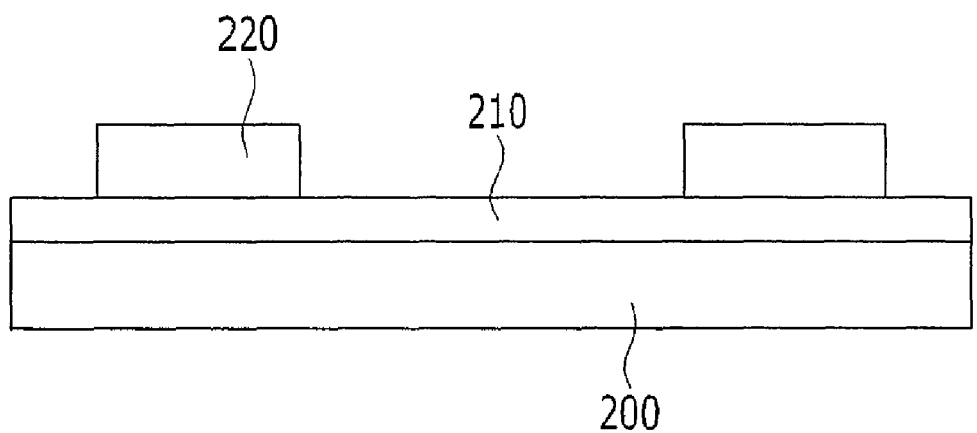

Referring to FIG. 10, an etching paste 220 is disposed (e.g., printed) on the first doping layer 210.

In one exemplary embodiment, a screen printing method or an inkjet printing method may be used to dispose the etching paste on the first doping layer 110.

The etching paste 220 may be disposed on the first doping layer 210 corresponding to the portion to be etched.

Figure 11:
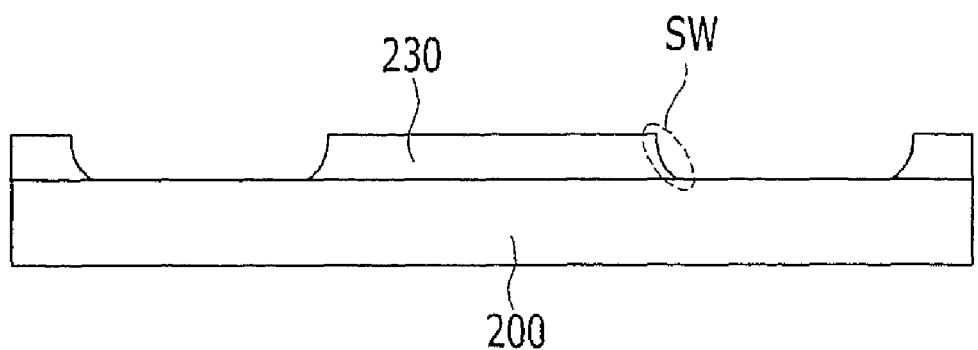

Referring to FIG. 11, the first doping layer 210 disposed with the etching paste 220 is etched to form a first doping layer pattern 230.

In an exemplary embodiment of the manufacturing method of the solar cell according to the present invention, isishape® from Merck & Co., Inc. of Germany is used as the etching paste 220 for the printing.

The isishape® may selectively etch the layers including at least one of the transparent conductive layer, silicon, silicon dioxide, silicon nitride, and various metals.

In one exemplary embodiment, the thickness of the first doping layer pattern 210 may be in the range of about 500 Å to about 20,000 Å.

If the first doping layer 210 is patterned such that the first doping layer pattern 230 is formed, a portion of the substrate 200 is exposed.

The process in which the etching paste 220 is used for forming the first doping layer pattern 230 is executed at room temperature of about 15° C. to about 25° C.

In the exemplary embodiment of according to the present invention, the isishape® provided by Merck & Co., Inc. used as the etching paste for the printing is disposed on the first doping layer 210 and etches the first doping layer 210 without application of heat to form the first doping layer pattern 230 such that the heat being applied to the first doping layer pattern 230 may be prevented, thereby preventing the substrate 100 from being doped due to a diffusion of an impurity.

In one exemplary embodiment, the first doping layer pattern 230 may include a silicon oxide doped with the N-type impurity.

In one exemplary embodiment, the silicon oxide may be silicon dioxide (SiO2), for example, but is not limited thereto.

In one exemplary embodiment, the N-type impurity may be phosphorus (P) or arsenic (As), for example, but is not limited thereto and may be other materials with similar characteristics.

In one exemplary embodiment, if the first doping layer pattern 230 is formed using the etching paste 220, a side wall SW of the first doping layer pattern 230 has a thickness gradation.

In detail, when etching the first doping layer 210 including the silicon oxide by the etching paste 220, the etching paste 220 flows to a the side surface thereof such that the thickness gradation is formed.

The substrate 200 includes a front side and a back side that is opposite to the front side.

The first doping layer pattern 230 is formed on the back side of the substrate 200.

The front side of the substrate 200 corresponds to a side into which light is absorbed from an outside.

In one exemplary embodiment, the etching paste 220 may be removed by deionized (DI) water after ultrasonic treatment.

The exemplary embodiment of the process discussed above is substantially the same as the exemplary embodiment of the present invention that is described with reference to FIGS. 1 to 7.

Figure 12:
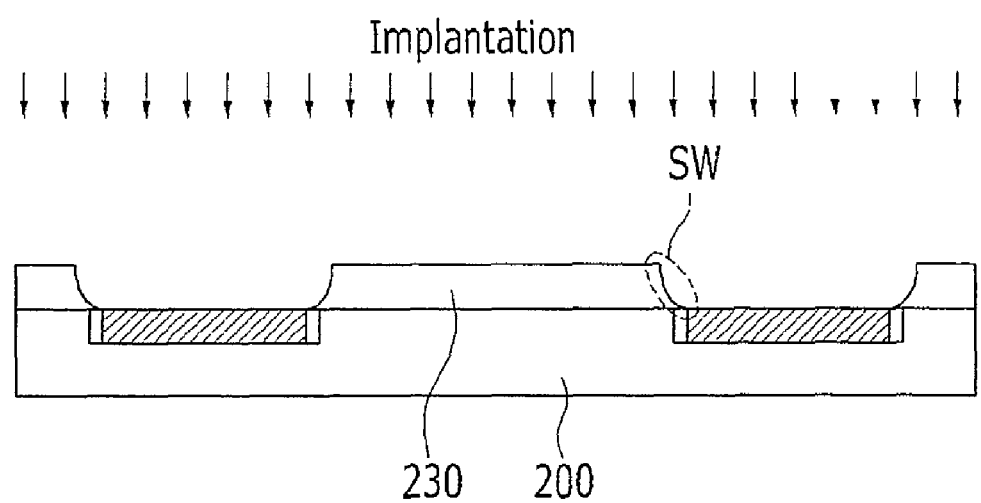

Referring to FIG. 12, impurity ions are injected into the surface of the substrate 200 using the first doping layer pattern 230 as the mask.

In one exemplary embodiment, the impurity ions may be boron (B), gallium (Ga), indium (In), and other materials with similar characteristics.

Figure 13:
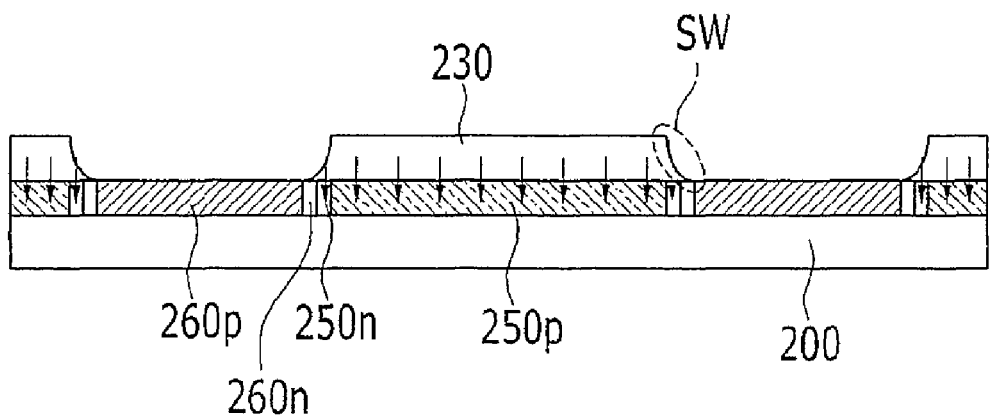

Referring to FIG. 13, a first doping region 250p is formed by diffusing the impurity from the first doping layer pattern 230 by performing the heat treatment process, and a second doping region 260p is formed by activating the impurity that is injected into the substrate 200 in an ion injection method using the heat treatment process.

In one exemplary embodiment, the heat treatment process may be executed at a temperature of about 1000° C. for about one hour.

Buffer layers 250n and 260n are formed between the first doping region 250p and the second doping region 260p.

The buffer layers 250n and 260n are formed in a surface where the side wall SW of the first doping layer pattern 230 contacts the substrate 200.

The thickness of the side wall SW of the first doping layer pattern 230 is gradually decreased according to a distance from the surface of the substrate 200 formed with the first doping region 150p to the surface of the substrate 200 formed with the second doping region 260p such that the buffer layers 250n and 260n are doped with the impurity at a relatively smaller amount than that of the first doping region 250p and the second doping region 260p.

That is, the buffer layers 250n and 260n are formed by the structural characteristic of the side wall SW of the first doping layer pattern 230.

The buffer layers 250n and 260n are LDD (lightly doped drain) regions, and include the first buffer layer 250n that is close to the first doping region 250p and the second buffer layer 260n that is close to the second doping region 260p.

In one exemplary embodiment, the first buffer layer 250n may be doped with a substantially same type of impurity as that of the first doping region 250p, and the second buffer layer 260n may be doped with a substantially same type of impurity as that of the second doping region 260p.

The buffer layers 250n and 260n prevent a short which occurs by directly contacting the first doping region 250p and the second doping region 260p with each other.

In an exemplary embodiment of the solar cell that is manufactured according to the present invention, the first doping region 250p and the second doping region 260p form the PN conjunction.

Figure 14:
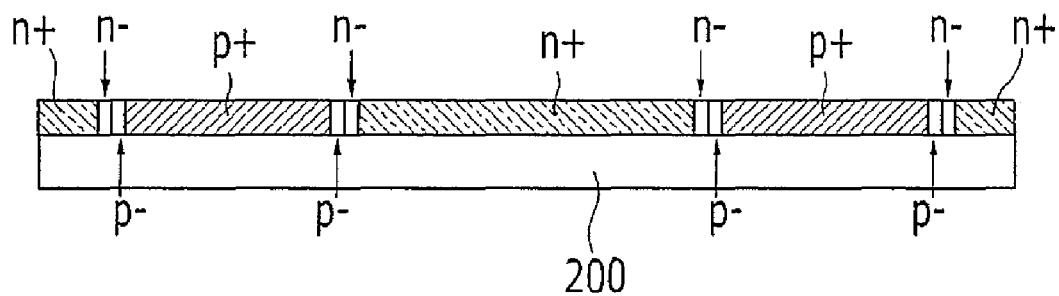

Referring to FIG. 14, the first doping layer pattern 230 that is formed on the substrate 200 is removed.

In the present exemplary embodiment, the first doping layer pattern 230 may be etched using hydrogen fluoride (HF) that has large etching selectivity for the substrate 200.

When the first doping region 250p and the second doping region 260p between which the buffer layers 250n and 260n are disposed are referred to as a first unit, the first unit is repeatedly formed on the surface of the substrate 200.

When connection is implemented by forming the electrode on the first doping region 250p and the second doping region 260p, it is possible to manufacture a solar cell that has a substantially same structure as the exemplary embodiment of the solar cell according to the present invention shown in FIG. 8.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a solar cell, the method comprising:

disposing a first doping layer on a substrate;

forming a first doping layer pattern by patterning the first doping layer to expose a portion of the substrate;

disposing a second doping layer on the first doping layer pattern to cover the exposed portion of the substrate;

diffusing an impurity from the first doping layer pattern which forms a first doping region in a surface of the substrate; and diffusing an impurity from the second doping layer which forms a second doping region in the surface of the substrate, wherein the forming of the first doping layer pattern uses an etching paste, and wherein a thickness of a side wall of the first doping layer pattern decreases with proximity to a boundary of the exposed portion of the substrate in the forming of the first doping layer pattern.

2. The method of claim 1, wherein the forming of the first doping layer pattern is executed at room temperature.

3. The method of claim 2, further comprising removing the etching paste with deionized water after ultrasonic wave treatment.

4. The method of claim 3, wherein a process time of the forming of the first doping layer pattern is controlled according to a thickness of the first doping layer.

5. The method of claim 4, wherein the process time is about two minutes.

6. The method of claim 1, wherein the forming of the first doping layer pattern includes forming the etching paste through at least one of a screen printing method and an inkjet printing method.

7. A method for manufacturing a solar cell, the method comprising:
   disposing a first doping layer on a substrate;
   forming a first doping layer pattern by patterning the first doping layer to expose a portion of the substrate;
   disposing a second doping layer on the first doping layer pattern to cover the exposed portion of the substrate;
   diffusing an impurity from the first doping layer pattern which forms a first doping region in a surface of the substrate; and
   diffusing an impurity from the second doping layer which forms a second doping region in the surface of the substrate,
   wherein the forming of the first doping layer pattern uses an etching paste, and
   wherein a buffer layer is formed between the first doping region and the second doping region.

8. The method of claim 7, wherein a first unit which includes the first doping region and the second doping region having the buffer layer is disposed therebetween is repeatedly formed on the surface of the substrate.

9. The method of claim 8, wherein the buffer layer is a lightly doped drain region, and includes a first buffer layer which is doped with a substantially same type of impurity as the impurity of the first doping region, and a second buffer layer which is doped with a substantially same type of impurity as the impurity of the second doping region.

10. The method of claim 9, wherein the forming of the first doping region and the second doping region by diffusing the impurity from the first doping layer pattern and the impurity from the second doping layer pattern comprises a heat treatment process.

11. The method of claim 10, further comprising removing the first doping layer pattern and the second doping layer.

12. The method of claim 11, wherein the forming of the first doping region is substantially simultaneously executed with the forming of the second doping region.

13. A method for manufacturing a solar cell, the method comprising:
   disposing a first doping layer on a substrate;
   forming a first doping layer pattern by patterning the first doping layer to expose a portion of the substrate;
   disposing a second doping layer on the first doping layer pattern to cover the exposed portion of the substrate;
   diffusing an impurity from the first doping layer pattern which forms a first doping region in a surface of the substrate; and
   diffusing an impurity from the second doping layer which forms a second doping region in the surface of the substrate,
   wherein the forming of the first doping layer pattern uses an etching paste, and
   wherein the substrate includes a front side and a back side, and the first doping region and the second doping region are disposed at the back side of the substrate.

14. The method of claim 13, further comprising forming a back side electrode which includes a first electrode which is connected to the first doping region and a second electrode which is connected to the second doping region on the back side of the substrate.

15. The method of claim 14, wherein light is absorbed from an outside through the front side of the substrate.

16. The method of claim 7, wherein the first doping layer and the second doping layer include silicon oxides which include different conductive impurities.

17. The method of claim 7, wherein the first doping region and the second doping region include different conductive impurities.

18. The method of claim 7, wherein the substrate is an N-type silicon wafer.

19. The method of claim 7, wherein the buffer layer is formed on a surface of the substrate which corresponds to a side wall of the first doping layer pattern.

* * * * *